(12) United States Patent
Nicoll et al.

(10) Patent No.: US 9,825,041 B1
(45) Date of Patent: Nov. 21, 2017

(54) INTEGRATED CIRCUIT STRUCTURE WITH INSULATED MEMORY DEVICE AND RELATED METHODS

(71) Applicant: GLOBALFOUNDRIES INC., Grand Cayman (KY)

(72) Inventors: William L. Nicoll, Pleasant Valley, NY (US); Byeong Y. Kim, Lagrangeville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/236,608

(22) Filed: Aug. 15, 2016

(51) Int. Cl.
| | |
|---|---|
| *H01L 27/108* | (2006.01) |
| *H01L 27/12* | (2006.01) |
| *H01L 29/792* | (2006.01) |
| *H01L 29/78* | (2006.01) |
| *H01L 29/51* | (2006.01) |
| *H01L 21/311* | (2006.01) |

(52) U.S. Cl.
CPC .. *H01L 27/10826* (2013.01); *H01L 21/31111* (2013.01); *H01L 27/10832* (2013.01); *H01L 27/10879* (2013.01); *H01L 27/1211* (2013.01); *H01L 29/513* (2013.01); *H01L 29/518* (2013.01); *H01L 29/785* (2013.01); *H01L 29/792* (2013.01)

(58) Field of Classification Search
CPC ......... H01L 27/10826; H01L 27/10832; H01L 27/1211; H01L 27/10879
See application file for complete search history.

(56) References Cited

U.S. PATENT DOCUMENTS

| | | | |
|---|---|---|---|
| 7,705,386 B2 | 4/2010 | Cheng et al. | |
| 2013/0320422 A1 | 12/2013 | Chang et al. | |

*Primary Examiner* — Douglas Menz
(74) *Attorney, Agent, or Firm* — Yuanmin Cai; Hoffman Warnick LLC

(57) ABSTRACT

Various embodiments include methods and integrated circuit (IC) structures. In some cases, an IC can include: a substrate; a deep trench within the substrate; a buried oxide (BOX) layer adjacent the deep trench; a first fin structure over the deep trench; a second fin structure over the BOX layer; an ONO layer over the first fin structure; and a gate electrode contacting the ONO layer.

19 Claims, 20 Drawing Sheets

INTEGRATED CIRCUIT STRUCTURE WITH INSULATED MEMORY DEVICE AND RELATED METHODS

BACKGROUND

The subject matter disclosed herein relates to integrated circuit devices. More particularly, the subject matter relates to processes in forming integrated circuit devices with insulated memory devices to control current leakage.

As integrated circuit (IC) technologies have advanced, the size of these devices has correspondingly decreased. These smaller ICs, with thinner device layers and insulating layers, can be subject to greater levels of leakage. Current leakage can cause device shorts, as well as diminished performance in IC devices. Leakage can be particularly challenging to control in memory devices, for example, in dynamic random access memory (DRAM) devices.

SUMMARY

Various embodiments include methods and integrated circuit structures. In some cases, a method of forming an integrated circuit structure can include: forming an ONO layer including: a first oxide; a nitride layer over the first oxide; and a second oxide layer over the nitride layer, over a precursor structure including: a substrate; a deep trench within the substrate; a buried oxide (BOX) layer above the deep trench within the substrate; a first fin structure over the deep trench; and a second fin structure over the BOX layer; forming a planarizing layer over the ONO layer; etching the planarizing layer to expose the second fin structure, leaving the first fin structure and a portion of the ONO layer covered by a remaining portion of the planarizing layer; removing the second oxide layer from exposed portions of the ONO layer; removing the remaining portion of the planarizing layer to expose the ONO layer over the first fin structure; and removing the nitride layer over the second fin structure, leaving the portion of the ONO layer over the first fin structure intact.

A first aspect of the disclosure includes a method of forming an integrated circuit structure, the method including: forming an ONO layer including: a first oxide; a nitride layer over the first oxide; and a second oxide layer over the nitride layer, over a precursor structure including: a substrate; a deep trench within the substrate; a buried oxide (BOX) layer above the deep trench within the substrate; a first fin structure over the deep trench; and a second fin structure over the BOX layer; forming a planarizing layer over the ONO layer; etching the planarizing layer to expose the second fin structure, leaving the first fin structure and a portion of the ONO layer covered by a remaining portion of the planarizing layer; removing the second oxide layer from exposed portions of the ONO layer; removing the remaining portion of the planarizing layer to expose the ONO layer over the first fin structure; and removing the nitride layer over the second fin structure, leaving the portion of the ONO layer over the first fin structure intact.

A second aspect of the disclosure includes a method of forming an integrated circuit structure, the method including: forming an ONO layer including: a first oxide; a nitride layer over the first oxide; and a second oxide layer over the nitride layer, over a precursor structure including: a substrate; a deep trench within the substrate; a buried oxide (BOX) layer adjacent the deep trench; a first fin structure over the deep trench; and a second fin structure over the BOX layer; forming an insulator layer adjacent the first fin structure; forming a planarizing layer over the ONO layer and the insulating layer; etching the planarizing layer to expose the second fin structure, leaving the first fin structure, the insulator layer and a portion of the ONO layer covered by a remaining portion of the planarizing layer; removing the second oxide layer from exposed portions of the ONO layer; removing the remaining portion of the planarizing layer to expose the portion of the ONO layer over the first fin structure; removing the nitride layer over the second fin structure, leaving the portion of the ONO layer over the first fin structure intact; removing exposed portions of the first oxide layer from the intact portion of the ONO layer over the first fin structure and a remaining portion of the second oxide layer over the second fin structure; forming a gate oxide over the second fin structure and the nitride layer remaining over the first fin structure; and forming a gate electrode to contact the gate oxide.

A third aspect of the disclosure includes an integrated circuit (IC) structure having: a substrate; a deep trench within the substrate; a buried oxide (BOX) layer above the deep trench within the substrate; a first fin structure over the deep trench; a second fin structure over the BOX layer; an ONO layer over the first fin structure; and a gate electrode contacting the ONO layer.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
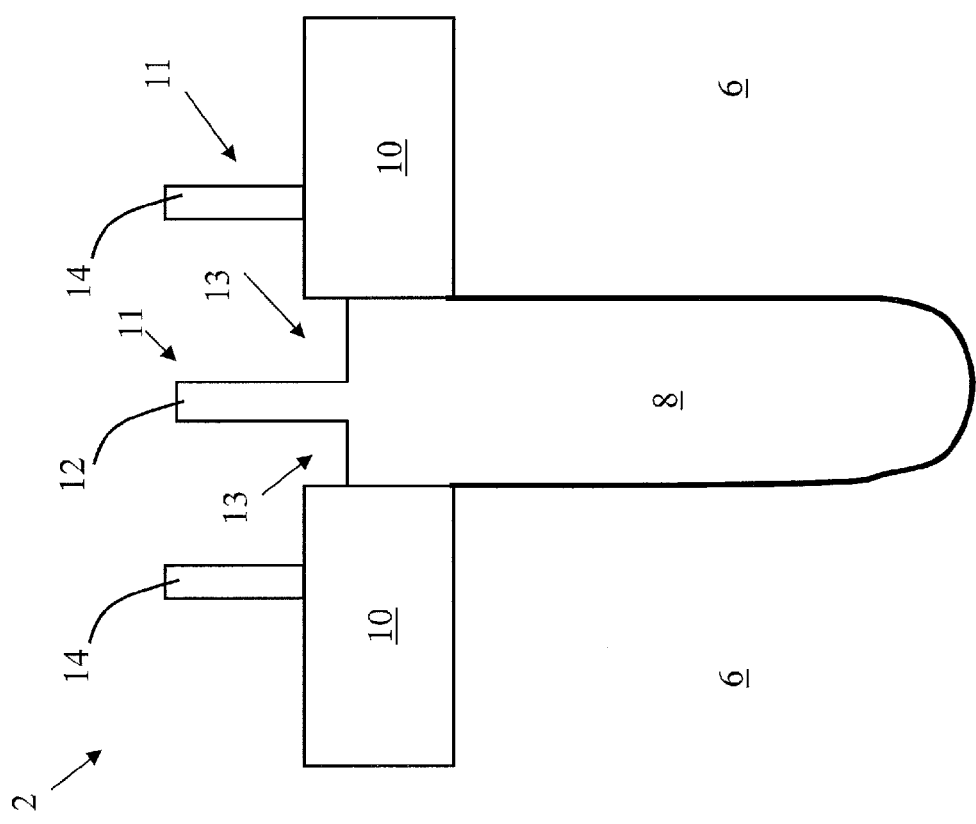
FIG. 1 shows a schematic cross-sectional view of a precursor structure, according to various embodiments.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted, the subject matter disclosed herein relates to integrated circuit (IC) structures. More particularly, the subject matter relates to processes in forming IC devices and the devices formed by such processes.

In the following description, reference is made to the accompanying drawings that form a part thereof, and in which specific embodiments are shown by way of illustration. These embodiments are described in sufficient detail to enable those skilled in the art to practice the present teachings and it is to be understood that other embodiments may be utilized and that changes may be made without departing from the scope of the present teachings. The following description is, therefore, merely illustrative.

As described herein, "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), molecular layer deposition, evaporation.

In contrast to conventional approaches, various embodiments of the disclosure include approaches for forming integrated circuit structures with reduced leakage current and greater reliability. The various embodiments described herein can be used to form devices which have improved leakage protection proximate memory components, when compared with conventional IC structures and methods of forming such structures. These devices can be formed with minimal additional steps to the traditional process flow, thereby maintaining low costs.

FIGS. 1-20 show schematic cross-sectional and top-down depictions of integrated circuit structures (and precursor structures) that illustrate processes performed according to various embodiments. It is understood that the processes outlined herein may be performed in a different order than described in some embodiments. Additionally, not all of the processes outlined herein need necessarily be performed according to various embodiments.

Figure 8:
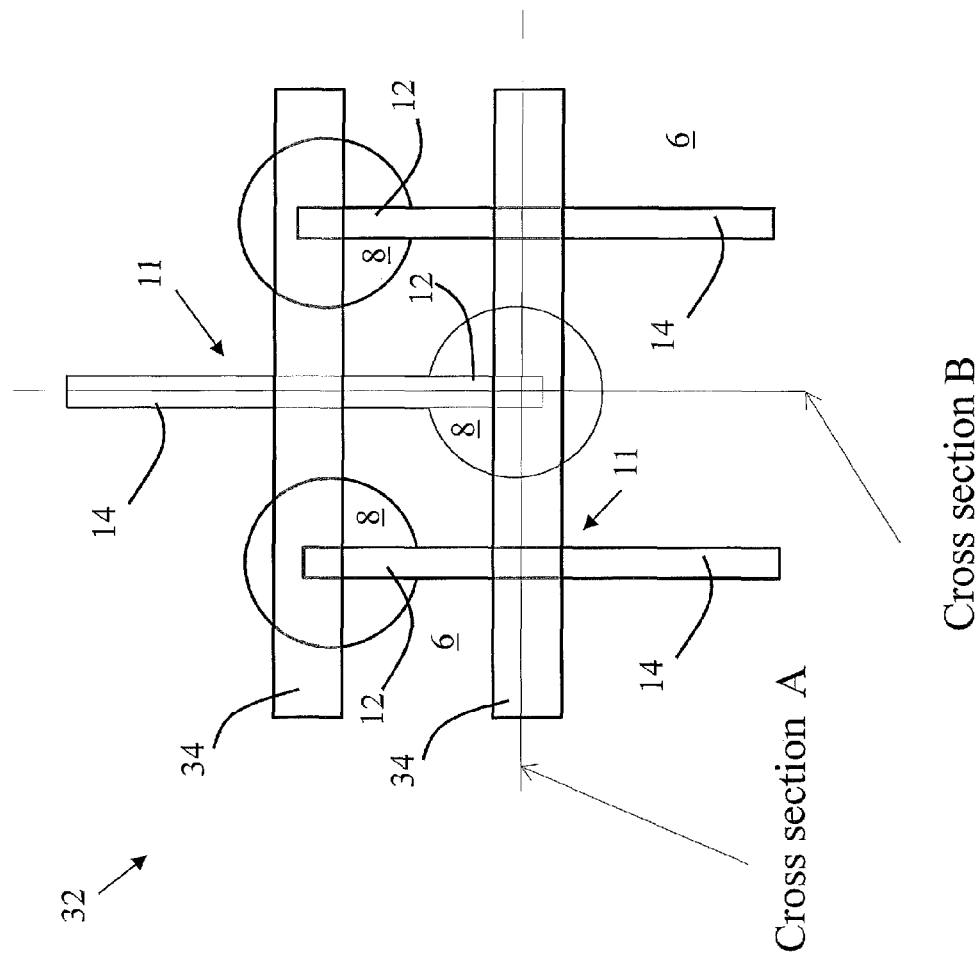
FIG. 8 shows a schematic top view of an integrated circuit structure formed according to various embodiments.

FIG. 1 shows a schematic cross-sectional view of a precursor structure 2. In various embodiments, precursor structure 2 can include known components formed according to various conventional methods prior to processes described herein. As shown, precursor structure 2 can include a substrate 6. In various embodiments, substrate 6 can be an n-type doped layer, which may include silicon, silicon germanium or any other suitable substrate material. As is known in the art of silicon-on-insulator (SOI) devices, substrate 6 may form part of a handle wafer (not shown), which may be used to subsequently create an SOI device. Substrate 6 can, for example, be epitaxially grown (e.g., with dopant), and in some cases, can act as a plate electrode in a deep trench (DT) capacitor. Within substrate 6 is a deep trench (DT) 8, which can be filled with a deep trench dielectric such as hafnium silicate (HfSiO) and a conductor, and may be formed according to any conventional approaches known in the art. Deep trench 8 is referred to as DT herein, but it is understood that DT 8 is a filled trench, and not a void, in the embodiments disclosed. A buried oxide (BOX) layer 10 is located adjacent DT 8. In various embodiments, precursor structure 2 can also include a plurality of fins 11 over DT 8 and BOX layer 10. As described herein, and shown in FIG. 8, each fin 11 can include fin structures 12, 14, which may contact distinct regions in an IC structure (e.g., IC structure 32, FIG. 8). In some cases, each fin 11 includes a first fin structure 12 over DT 8, where first fin structure 12 is connected (e.g., contacting) to DT 8 (vertically) and separated from BOX layer 10 (horizontally). Returning to FIG. 1, in various embodiments, first fin structure 12 is composed of polysilicon, and is located between adjacent regions of BOX layer 10. Also shown, precursor structure 2 can include fins 11 with a second fin structure 14 (two shown in this depiction in FIG. 1, as a set of fin structures 14) over BOX layer 10. First fin structure 12 and second fin structure 14 can be part of a continuous fin 11 in a DRAM cell array layout as shown in FIG. 8 with cross section B, and the cross section A can locate first fin structure 12 between adjacent second fin structure(s) 14. Adjacent first fin structure 12 is a shallow recess 13, which can be formed by selective etching processes known in the art.

Figure 2:
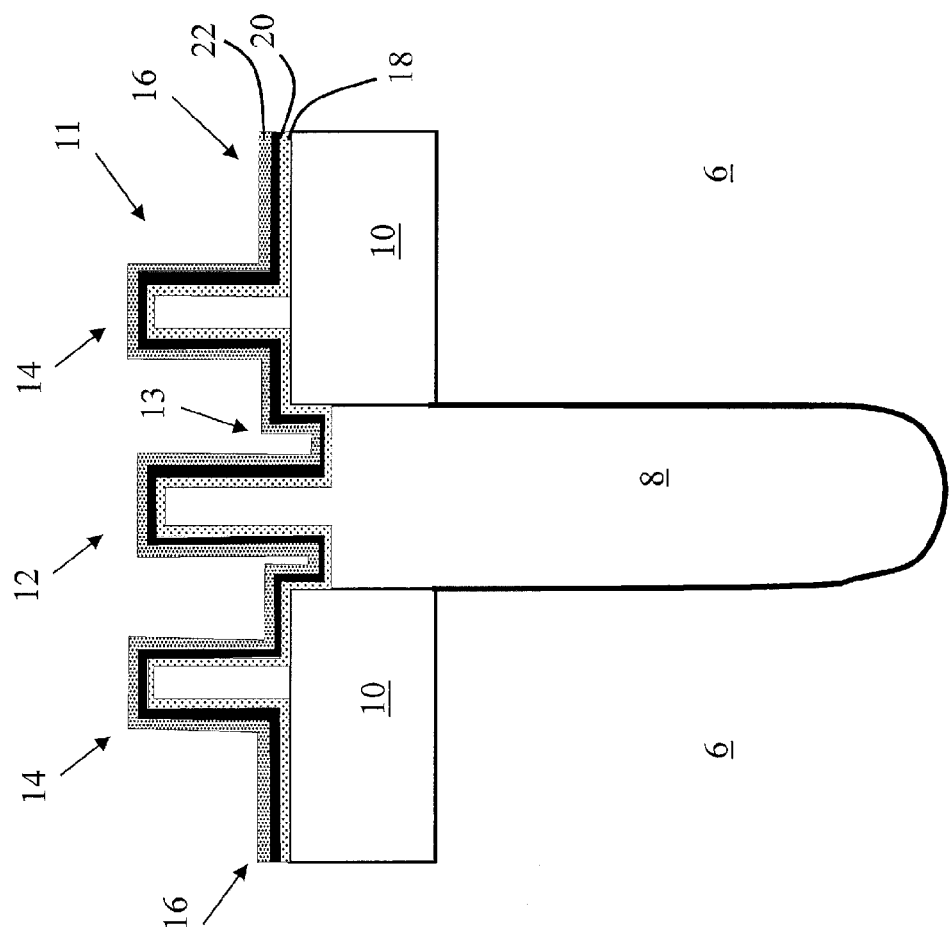
FIG. 2 shows a schematic cross-sectional view of the structure of FIG. 1, undergoing a process according to various embodiments.

FIG. 2 illustrates a first process in a method according to various embodiments. As shown, the process can include forming an ONO layer 16 over precursor structure 2. In various embodiments, ONO layer 16 can include a first oxide layer 18; a nitride layer 20 over first oxide layer 18, and a second oxide layer 22 over nitride layer 20. In some cases, nitride layer 20 can include a nitride deposited by furnace molecular layer deposition (MLD), and oxide layers 18, 22 may include oxide deposited by atomic layer deposition (ALD). In some particular cases, first and second oxide layers 18, 22 have a thickness between approximately 1-10 nanometers, where nitride layer 20 has a thickness between approximately 1-10 nanometers as well. In various embodiments, ONO layer 16 is deposited, e.g., as three distinct layers (first oxide layer 18, nitride layer 20, and second oxide layer 22) which may be conformal layers, according to any deposition technique described herein, e.g., ALD, or any other conformal deposition process. In some cases, deposition is performed at temperatures below 800 degrees Celsius to avoid dopant redistribution inside of DT material.

Figure 3:
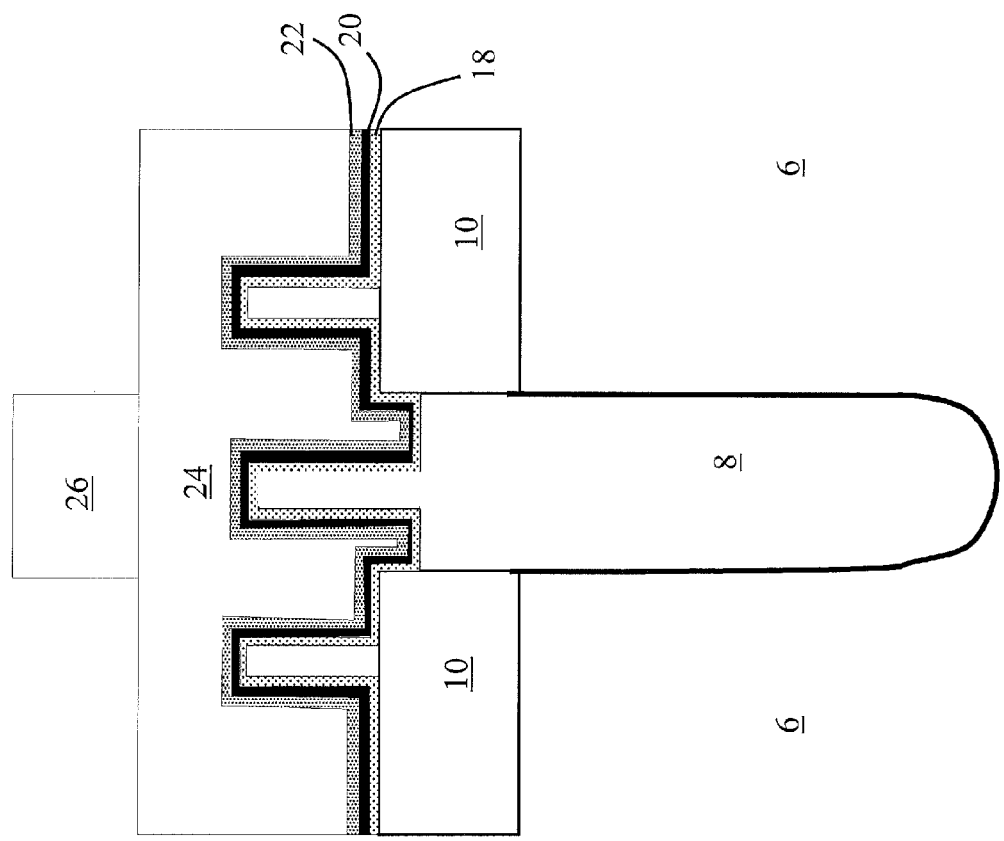
FIG. 3 shows a schematic cross-sectional view of a structure undergoing an additional process in a method according to various embodiments.

FIG. 3 illustrates another process in a method according to various embodiments. As shown, the process can include forming a planarizing layer 24 over ONO layer 16 (more specifically, contacting second oxide layer 22). In various embodiments, planarizing layer 24 is deposited over ONO layer 16 according to any deposition technique described herein. Planarizing layer 24 can include conventional planarizing materials, and in some cases, can include an organic material, such as any conventional organic material providing etch selectivity relative to adjacent photoresist, as well as gap filling and self-leveling characteristics. In various embodiments, a photoresist 26 is formed over planarizing layer 24, and may be deposited according to any deposition techniques described herein. Photoresist 26 can include any suitable photoresist material, including conventional photoresist material(s) capable of meeting the critical dimension requirements of the processes described herein. In some cases, photoresist 26 may be formed using conventional photolithography techniques, including but not limited to deep ultraviolet (DUV) or extreme ultraviolet (EUV) processes or multiple patterning processes. In some cases, photoresist 26 can include a silicon anti-reflective coating (SiARC), with a silicon concentration, for example, below approximately 20 percent, so as to ease subsequent removal (e.g., via a conventional sulfuric acid and hydrogen peroxide solution). The SiARC in the photoresist 26 can be etch selective to planarizing layer 24.

Figure 4:
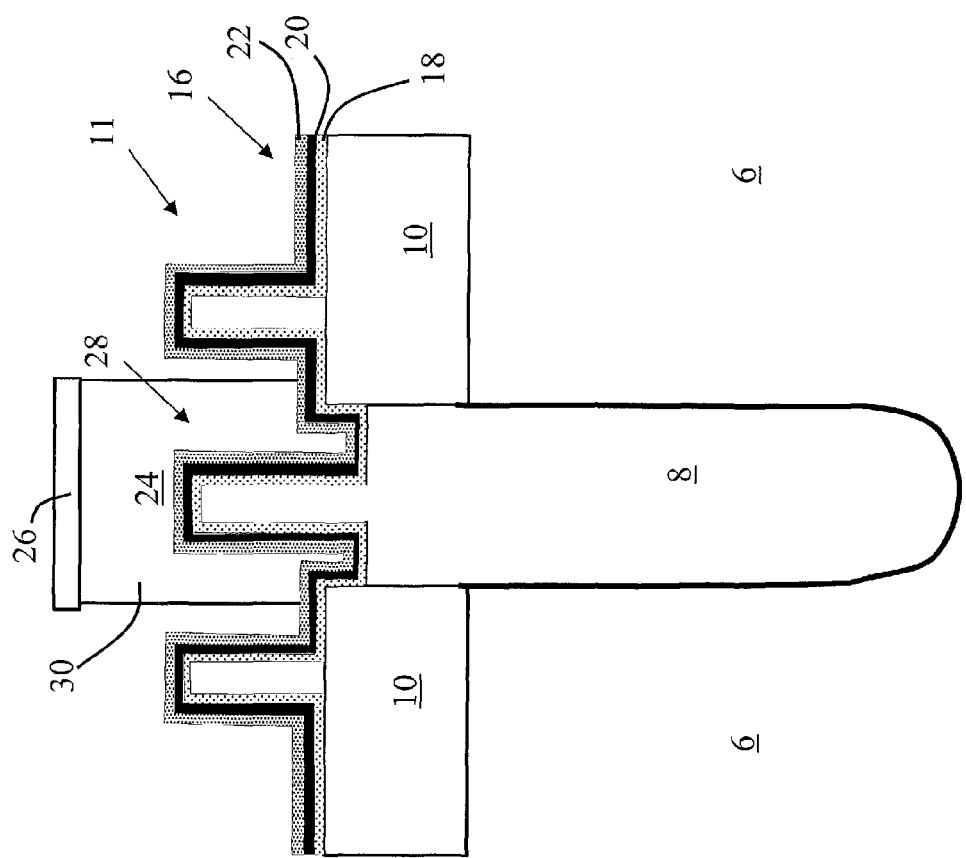
FIG. 4 shows a schematic cross-sectional view of a structure undergoing an additional process in a method according to various embodiments.

FIG. 4 illustrates an additional process in a method according to various embodiments. As shown, the process can include etching planarizing layer 24 to expose second fin structure(s) 14, leaving first fin structure 12 and a portion 28 of ONO layer 16 covered by a remaining portion 30 of planarizing layer 24. In various embodiments, photoresist 26 can be used as an etch guard over planarizing layer 24 during the etching process. In some cases, etching of planarizing layer 24 can include anisotropically etching, for example, using a plasma etch. ONO layer 16 can aid in preventing plasma damage to underlying second fin structure(s) 14 during etching, according to various embodiments.

Figure 5:
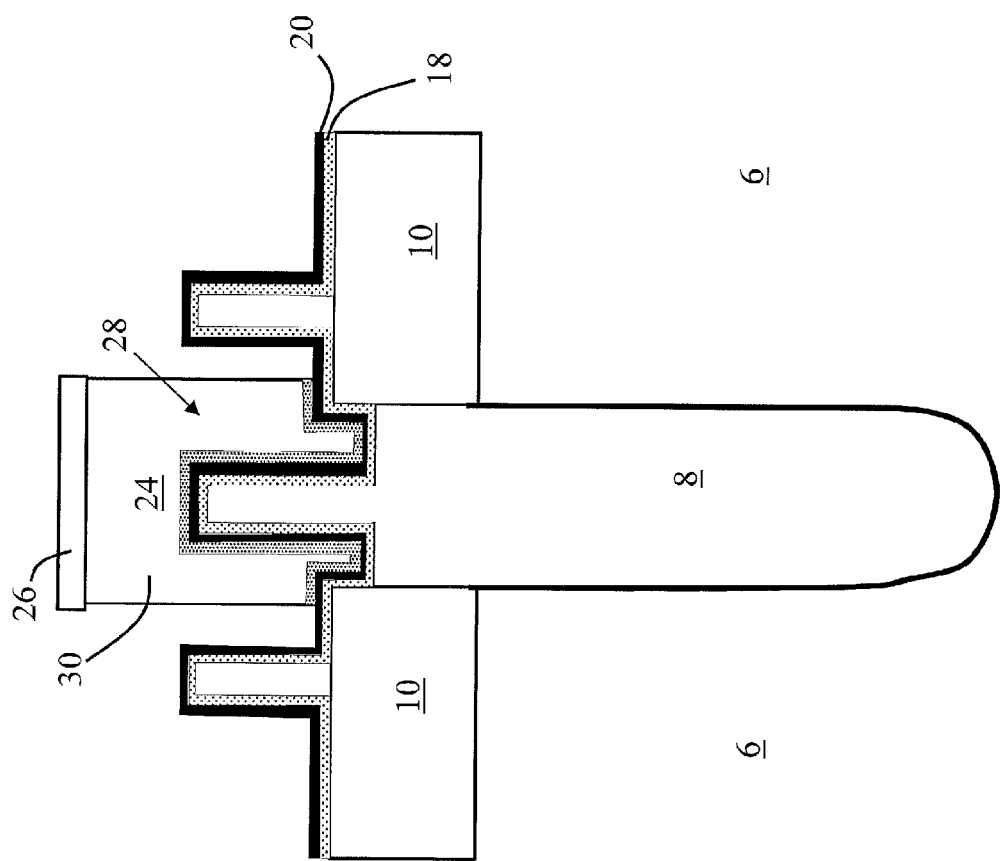
FIG. 5 shows a schematic cross-sectional view of a structure undergoing an additional process in a method according to various embodiments.

FIG. 5 illustrates an additional process in a method according to various embodiments. As shown, the process can include removing second oxide layer 22 from exposed portions of ONO layer 16. In various embodiments, this can include using planarizing layer 24 and photoresist 26 to mask first fin structure 12 (and ONO layer 16 overlying first fin structure 12), while etching the exposed second oxide layer 22. In various embodiments, this etching can include any isotropic etch of silicon oxide selective to silicon nitride and planarizing layer 24, such as dilute hydrofluoric acid.

Figure 6:
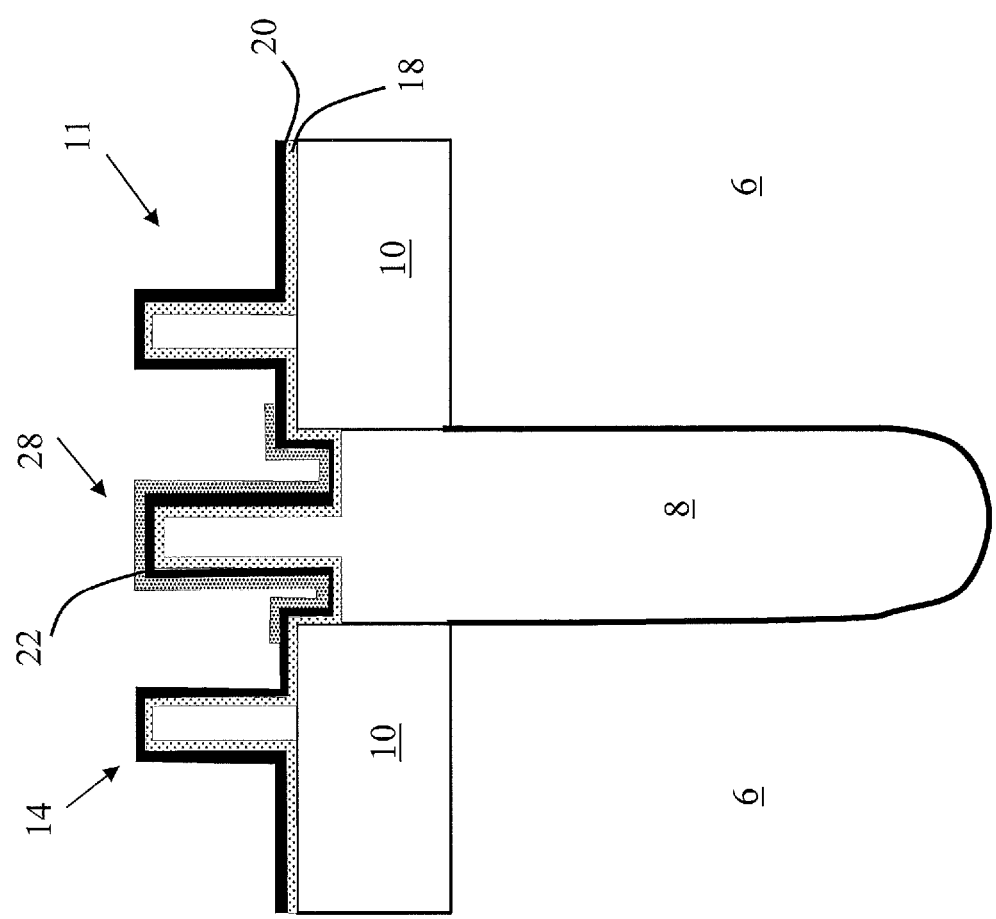
FIG. 6 shows a schematic cross-sectional view of a structure undergoing an additional process in a method according to various embodiments.

FIG. 6 illustrates an additional process in a method according to various embodiments. As shown, the process can include removing the remaining portion 30 of planarizing layer 24 to expose (portion 28 of) ONO layer 16 over first fin structure 12. This process can include wet stripping of planarizing layer 24 and photoresist 26, according to any known wet stripping approach, such as wet cleaning using sulfuric acid and hydrogen peroxide solution. The sulfuric acid and hydrogen peroxide solution can be injected with higher temperature up to 300° C. for better removal of the planarizing layer and photoresist 26 with SiARC while the wafer is spinning. This wet removal process can be beneficial in comparison to a dry removal process, as a dry process is more likely to cause structural damage to the underlying fin structure (e.g., first fin structure 12 and/or second fin structure(s) 14).

Figure 7:
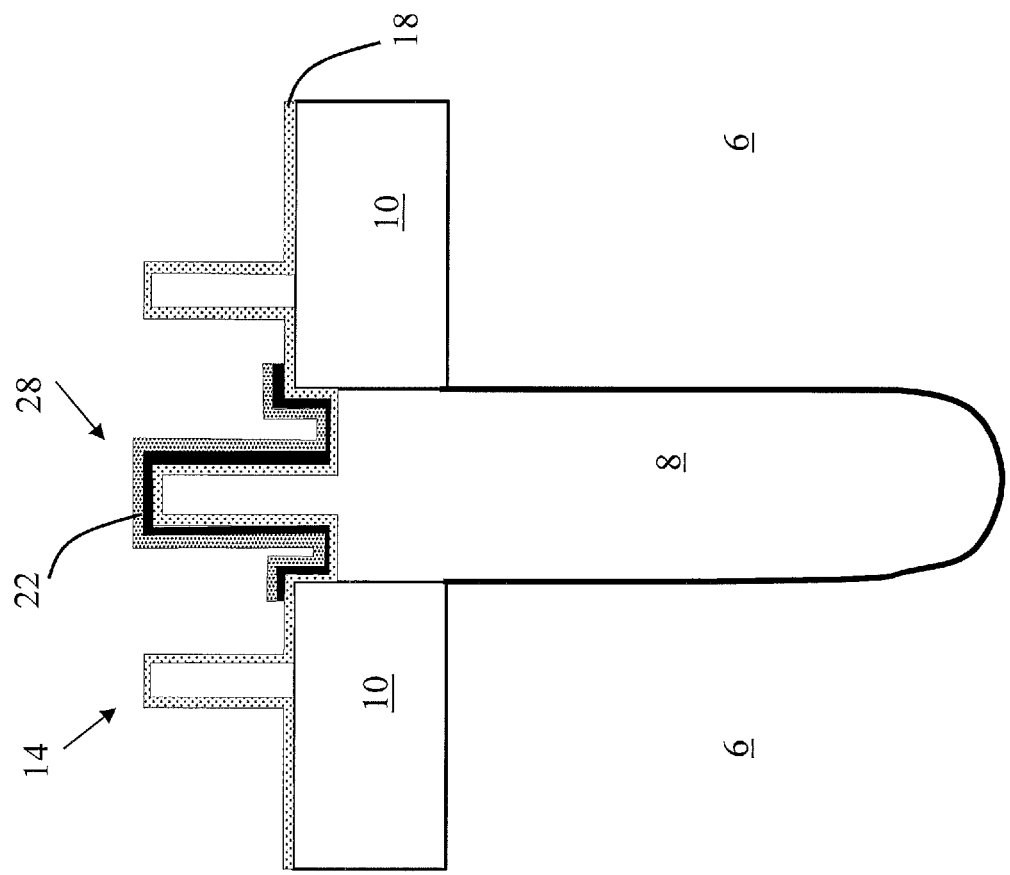
FIG. 7 shows a schematic cross-sectional view of a structure undergoing an additional process in a method according to various embodiments.

FIG. 7 illustrates an additional process in a method according to various embodiments. As shown, the process can include removing nitride layer 20 over second fin structure(s) 14, leaving the portion 28 of ONO layer 16 over first fin structure 12 intact. In various embodiments, this process can include wet etching nitride layer 20 according to known wet etching processes, such as hot phosphoric acid.

Figure 9:
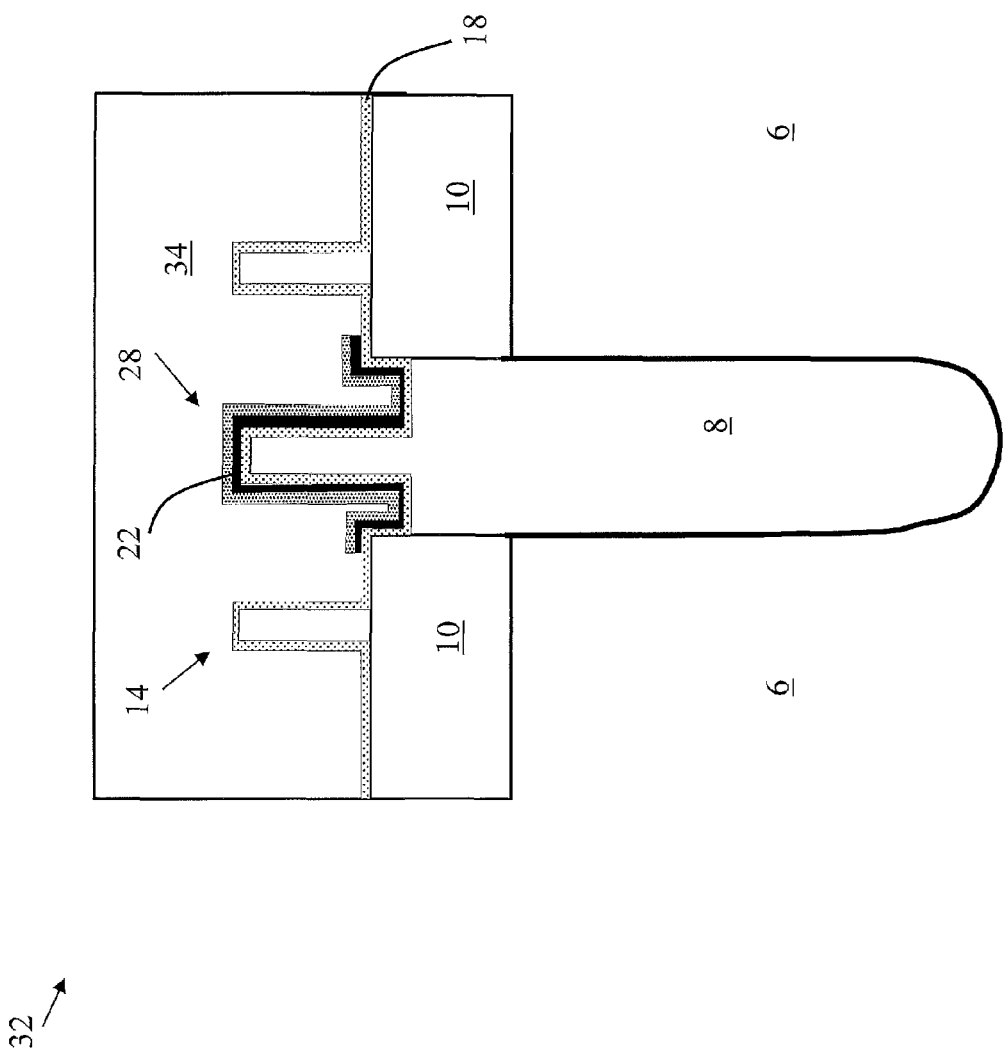
FIG. 9 shows a schematic cross-sectional view of the integrated circuit structure of FIG. 8 through Cross-section A.
Figure 10:
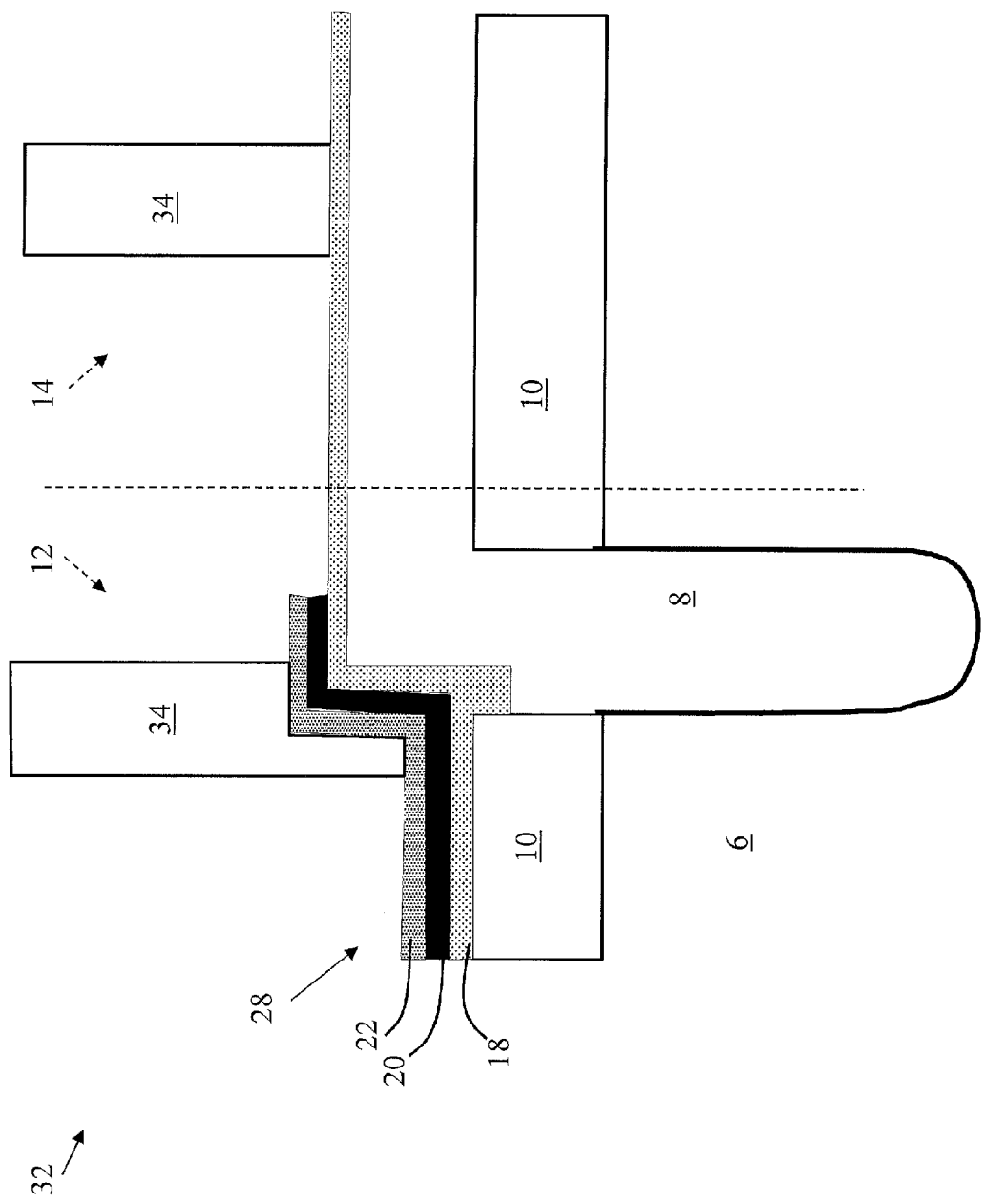
FIG. 10 shows a schematic cross-sectional view of the integrated circuit structure of FIG. 8 through Cross-section B.

FIG. 8 shows a top view of an integrated circuit (IC) structure 32 after an additional process in a method according to various embodiments. FIG. 9 shows a first cross-sectional view from FIG. 8, through Cross-section A, and FIG. 10 shows a second cross-sectional view from FIG. 8, through Cross-section B. As shown, the process can include forming a gate electrode 34 to contact the portion 28 of ONO layer 16 over first fin structure 12. Gate electrode 34 can be formed according to any known approaches, for example, forming a dummy gate electrode with conventional deposition and etching technique, filling insulator between gate electrode, and removing the dummy gate, and depositing a low resistance gate material (e.g., including aluminum, tungsten, etc.) to contact ONO layer 16. Additional gate electrodes 34 can be similarly formed to contact other layers, such as first oxide layer 18 on top of fin 14. As shown in FIGS. 8-10, a gate electrode (e.g., gate electrode 34) overlying a deep trench (e.g., DT 8) is referred to as a passing word line (compared with an active word line, which overlies a fin structure). Both passing word lines and active word lines shown according to the disclosed embodiments form a continuous line, and because of the processes described herein, the insulator thickness between the passing word line and the deep trench is increased relative to conventional approaches and structures.

IC structure 2 can provide enhanced isolation with lower leakage current, relative to conventional integrated circuit devices, due to the remaining portion 28 of ONO layer 16 over first fin structure 12. In particular, ONO layer 16 over first fin structure 12 can more effectively isolate fin structure 12 and the underlying DT 8 from gate electrode 34 than conventional IC structures.

Figure 11:
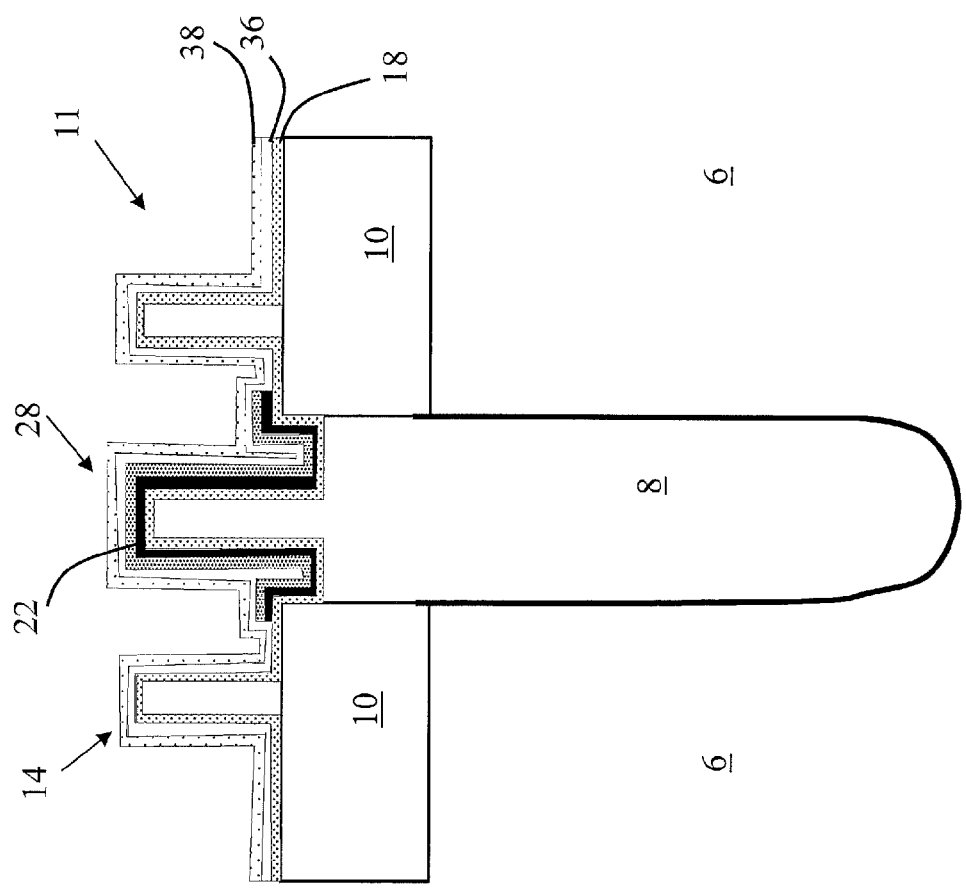
FIG. 11 shows a schematic cross-sectional view of a structure undergoing an additional process in another method according to additional embodiments.
Figure 12:
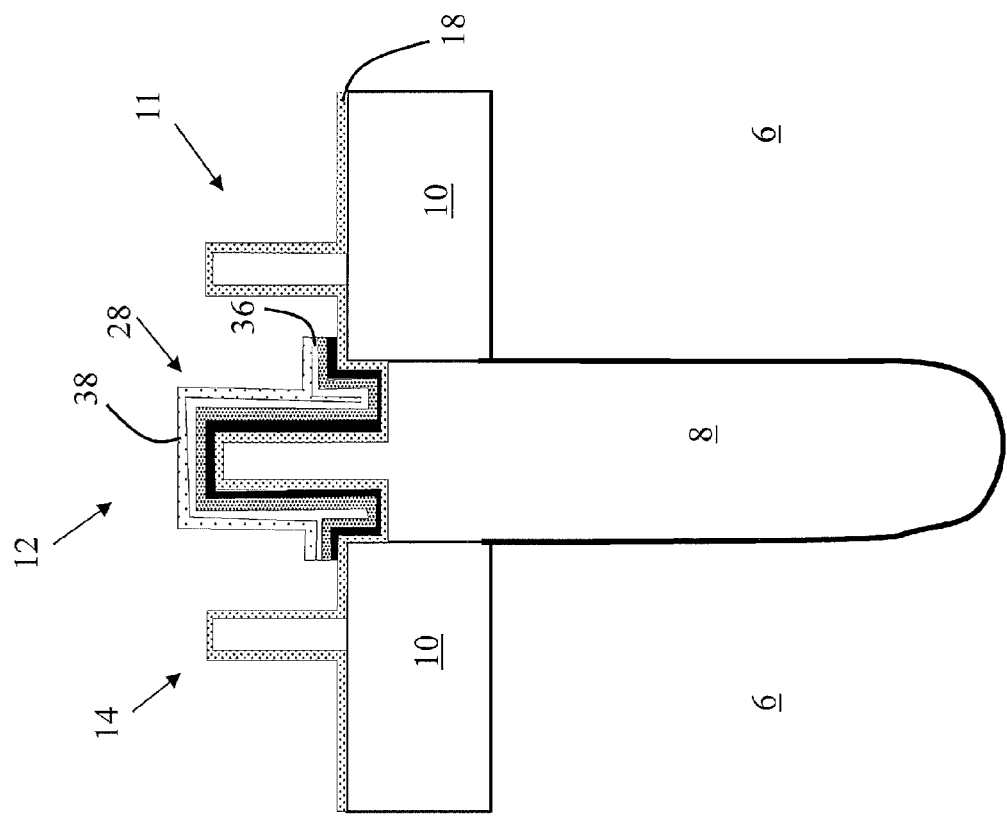
FIG. 12 shows a schematic cross-sectional view of a structure undergoing an additional process in another method according to additional embodiments.

FIG. 11 illustrates another process in additional embodiments, whereby, after removing nitride layer 20 over second fin structure(s) 14, as shown in FIG. 7, the process includes: forming a second nitride layer 36 over the portion 28 of ONO layer 16 over first fin structure 11, and a third oxide layer 38 over second nitride layer 36. In various embodiments, second nitride layer 36 is deposited over portion 28 of ONO layer 16, as well as over remaining (exposed) first oxide layer 18, according to any deposition technique described herein. Third oxide layer 38 can be deposited over second nitride layer according to any deposition technique described herein. FIG. 12 shows an intermediate structure formed from the precursor structure of FIG. 11 including second nitride layer 36 and third oxide layer 38. That is, following forming the structure depicted in FIG. 11, a process can include forming a planarizing layer 24 over third oxide layer 38, etching planarizing layer 24 to expose second fin structure(s) 14 while covering first fin structure 12, removing exposed portions of third oxide layer 38, removing the remaining portion of planarizing layer 24 to expose third oxide layer 38 over first fin structure 12, and removing second nitride layer 36 over second fin structure(s) 14. As shown in FIG. 12, second nitride layer 36 and third oxide layer 38 may, in combination with first oxide layer 18, first nitride layer 20 and second oxide layer 22, entirely fill shallow recess 13 (FIG. 1) prior to formation of one or more gate electrodes 34.

Figure 13:
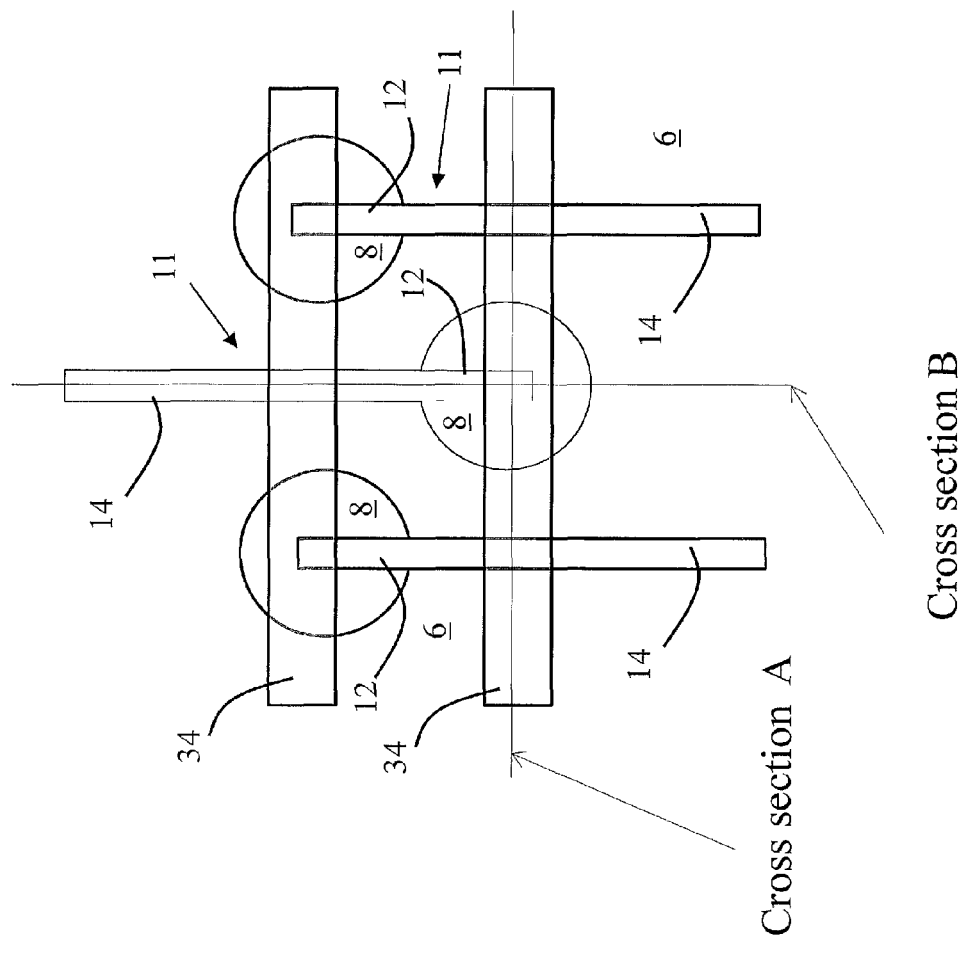
FIG. 13 shows a schematic top view of another integrated circuit structure formed according to various embodiments.
Figure 14:
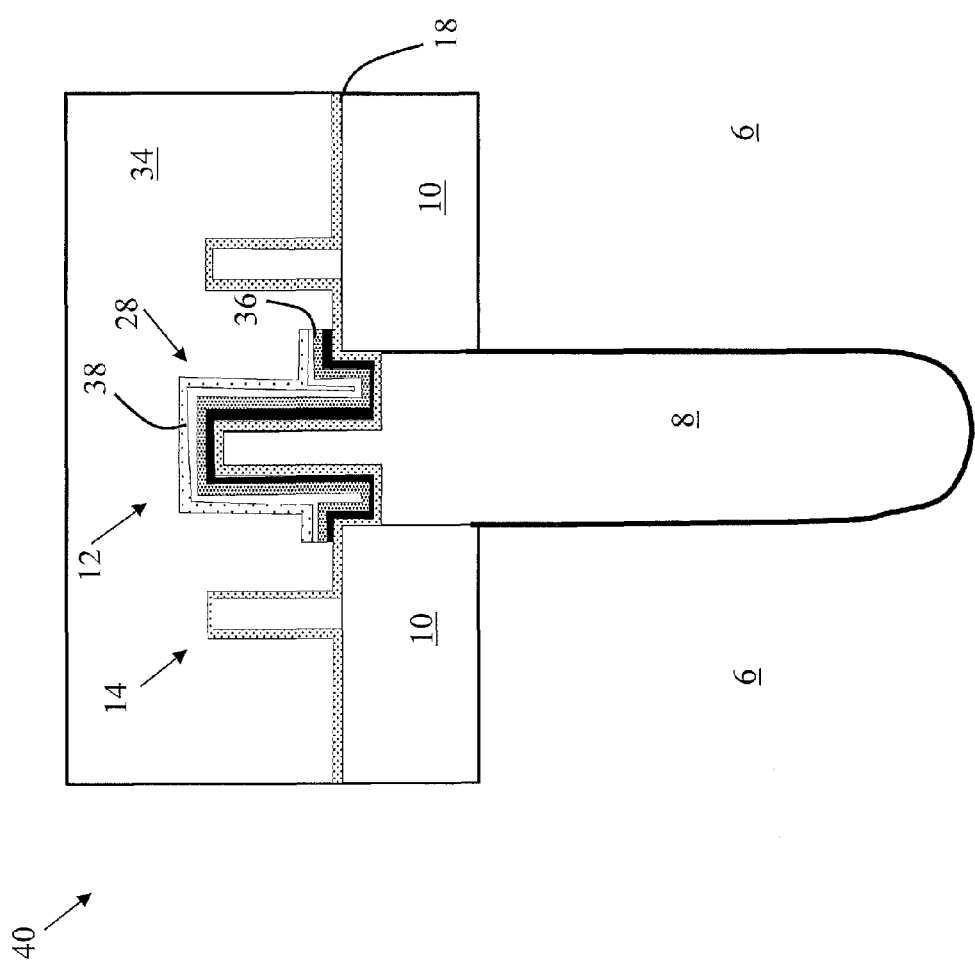
FIG. 14 shows a schematic cross-sectional view of the integrated circuit structure of FIG. 13 through Cross-section A.

FIG. 13 shows a top view of an integrated circuit (IC) structure 40 after an additional process following FIG. 12, in a method according to various embodiments. FIG. 14 shows a first cross-sectional view from FIG. 13, through Cross-section A. As shown, the process can include forming a gate electrode 34 to contact the third oxide layer 38 over first fin structure 12. Gate electrode 34 can be formed according to any known approaches, for example, depositing a dummy gate material and pattering with mask followed by replacing with low resistance metal as a replacement gate technique well known in prior art to contact ONO layer 16. Additional gate electrodes 34 can be similarly formed to contact other layers, such as first oxide layer 18.

Figure 15:
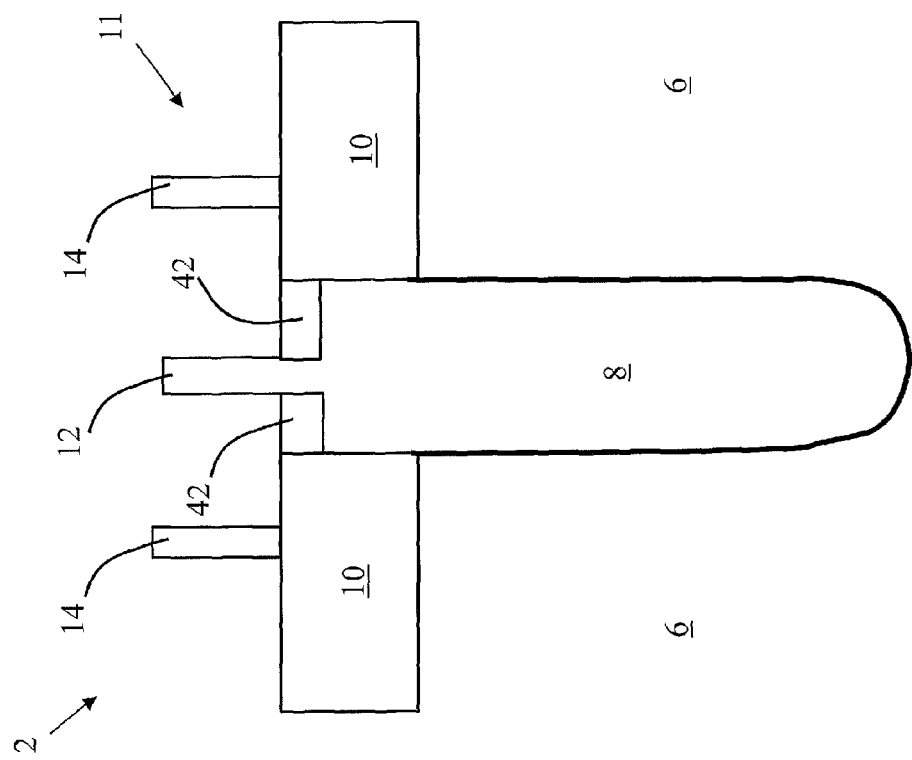
FIG. 15 shows a schematic cross-sectional view of a structure undergoing an additional process in another method according to additional embodiments.
Figure 16:
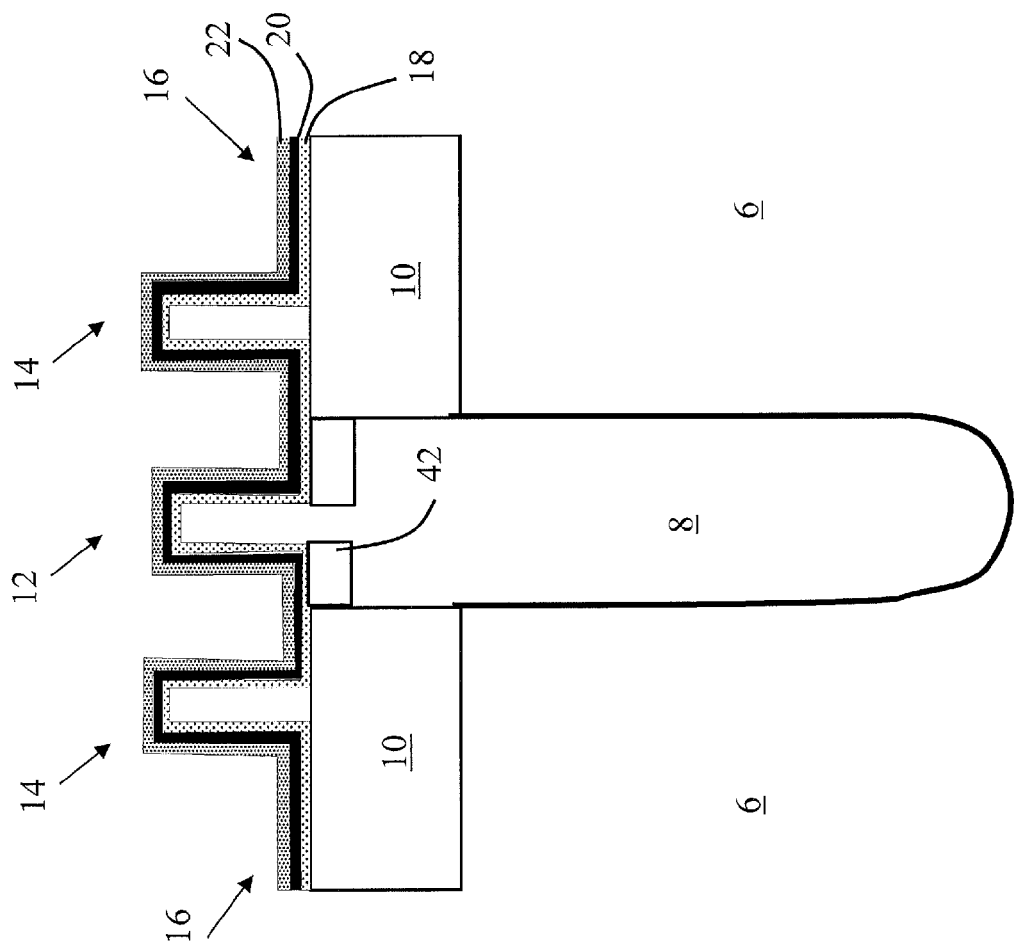
FIG. 16 shows a schematic cross-sectional view of a structure undergoing an additional process in another method according to additional embodiments.
Figure 17:
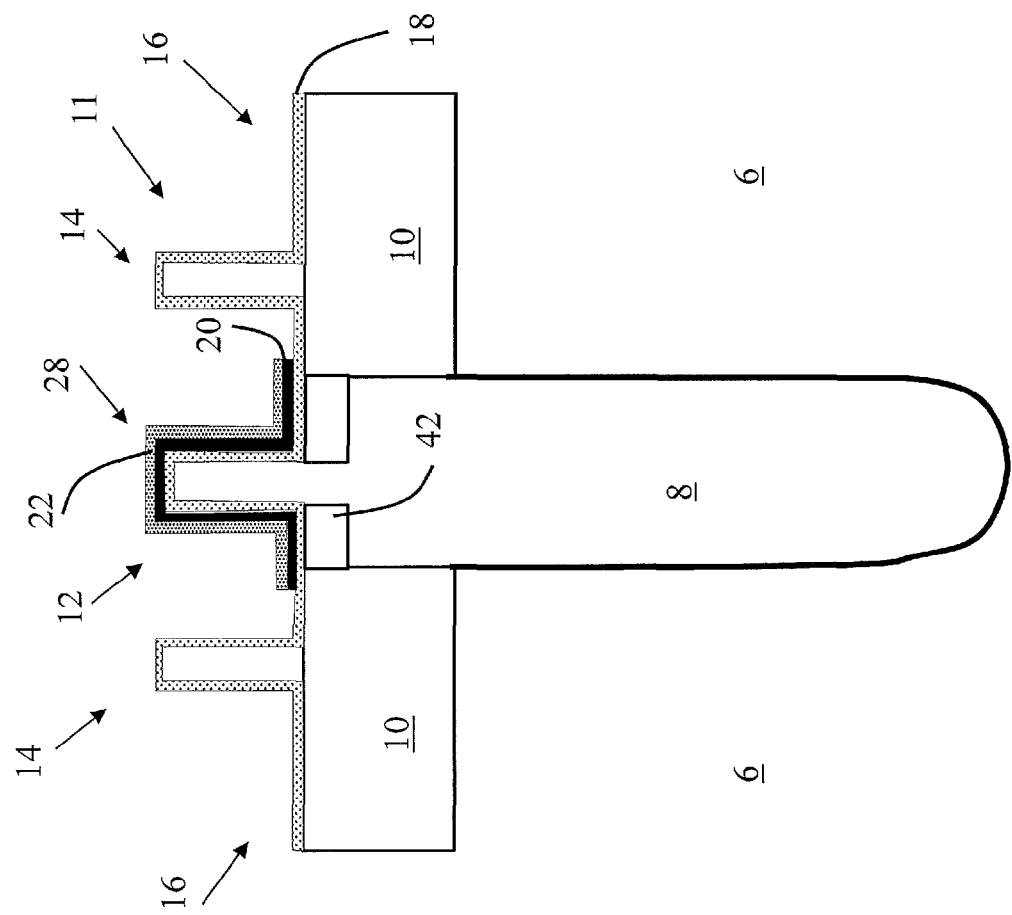
FIG. 17 shows a schematic cross-sectional view of a structure undergoing an additional process in another method according to additional embodiments.
Figure 18:
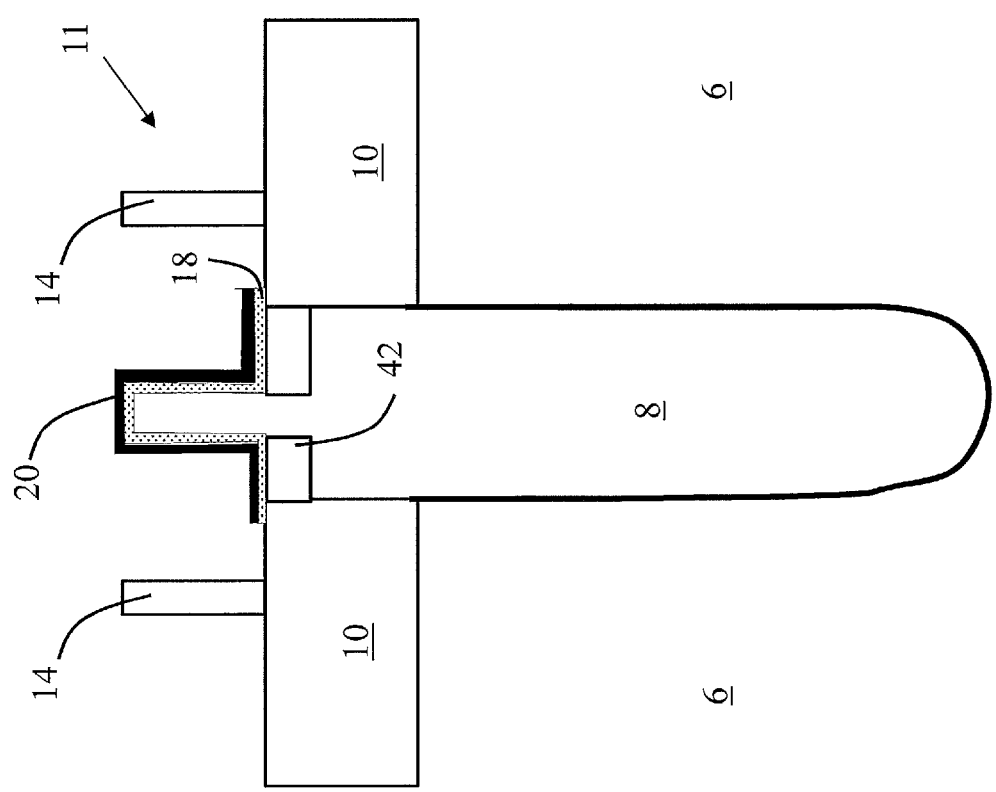
FIG. 18 shows a schematic cross-sectional view of a structure undergoing an additional process in another method according to additional embodiments.
Figure 19:
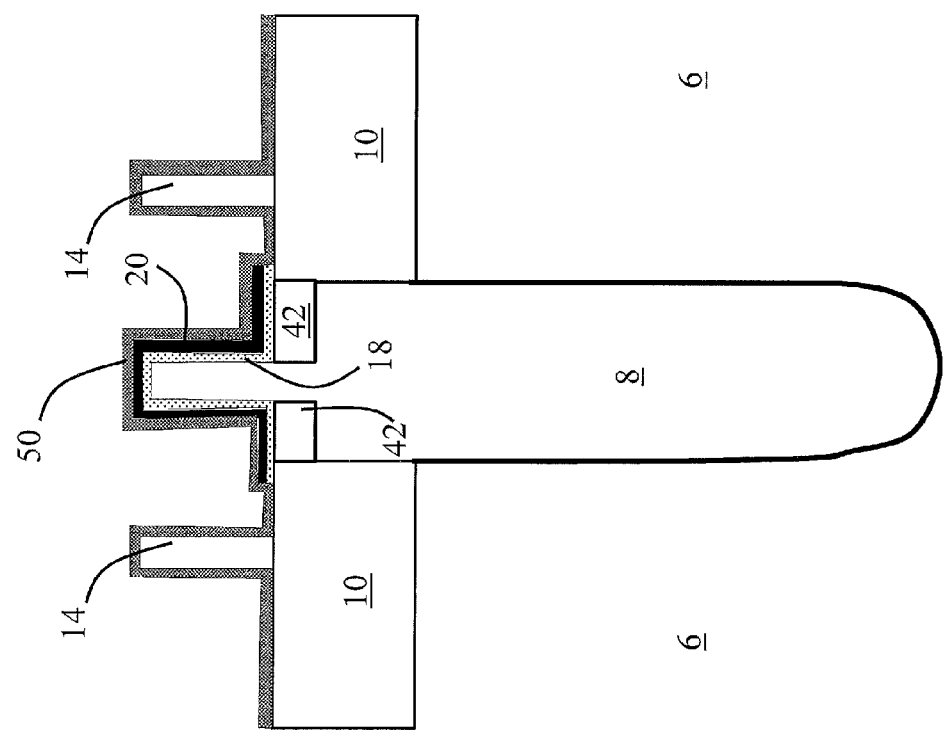
FIG. 19 shows a schematic cross-sectional view of a structure undergoing an additional process in another method according to additional embodiments.
Figure 20:
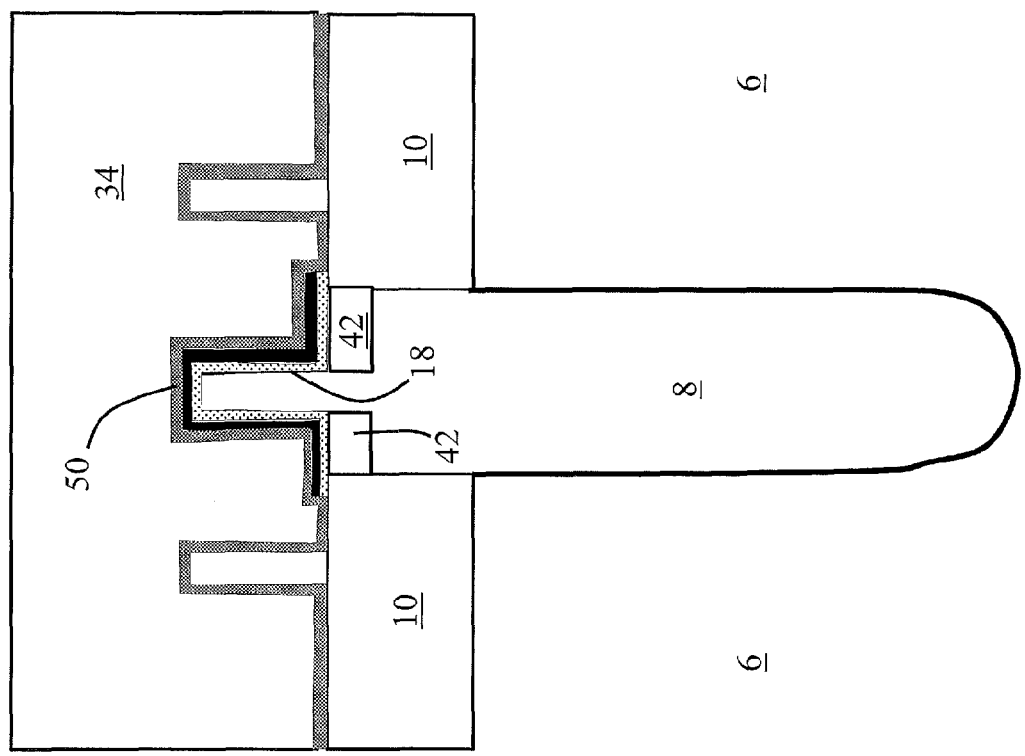
FIG. 20 shows a schematic cross-sectional view of another integrated circuit structure according to additional embodiments.

FIG. 15 illustrates another process in further additional embodiments, whereby, prior to forming ONO layer 16, as shown in FIG. 2, the process includes: forming an insulator 42 adjacent first fin structure 12. Insulator 42 can include silicon oxide and/or silicon nitride, and can be formed, for example, by depositing insulator material between BOX layer 10 and first fin structure 12. FIG. 16 illustrates a subsequent process following FIG. 15, where ONO layer 16 is formed as described with respect to FIG. 2. Processes described with reference to FIGS. 3-7 may then be performed such that, as shown in FIG. 17, ONO layer 16 remains (completely intact) only over first fin structure 12, where first oxide layer 18 remains over second fin structure(s) 14. Following this process, according to various embodiments, FIG. 18 illustrates another process whereby first oxide layer 18 is etched, e.g., using a conventional wet etch (e.g., any isotropic wet etching method, such as those using hydrofluoric acid), and in FIG. 19, a gate oxide 50 is formed (e.g., deposited) over the nitride layer 10 and the exposed second fin structure(s) 14. FIG. 20 shows formation of a gate electrode 34 to contact the gate oxide 50, as described with respect to other embodiments herein.

It is understood that the herein-noted approaches can be implemented in any stage of integrated circuit formation, e.g., front-end of line (FEOL), back-end of line (BEOL) and/or middle of line (MOL) processes. As is known in the art, FEOL can include operations performed on the semiconductor wafer in the course of device manufacturing up to first metallization, BEOL can include operations performed on the semiconductor wafer in the course of device manufacturing following first metallization, and MOL can include operations performed on the semiconductor wafer during first metallization.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. It is further understood that the terms "front" and "back" are not intended to be limiting and are intended to be interchangeable where appropriate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method of forming an integrated circuit (IC) structure, the method comprising:
   forming an ONO layer including: a first oxide layer; a nitride layer over the first oxide layer; and a second oxide layer over the nitride layer, over a precursor structure including: a substrate; a deep trench within the substrate; a buried oxide (BOX) layer adjacent the deep trench; a first fin structure over the deep trench; and a second fin structure over the BOX layer;
   forming a planarizing layer over the ONO layer;
   etching the planarizing layer to expose the second fin structure, leaving the first fin structure and a portion of the ONO layer covered by a remaining portion of the planarizing layer;
   removing the second oxide layer from exposed portions of the ONO layer;

removing the remaining portion of the planarizing layer to expose the ONO layer over the first fin structure;
removing the nitride layer over the second fin structure, leaving the portion of the ONO layer over the first fin structure intact; and
forming a gate electrode to contact the portion of the ONO layer over the first fin structure.

2. The method of claim 1, further comprising forming a photoresist layer over the planarizing layer.

3. The method of claim 1, wherein the first fin structure forms part of a first fin, and wherein the second fin structure forms a portion of a second fin adjacent the first fin.

4. The method of claim 3, wherein the first fin is oriented in an opposite direction relative to the second fin.

5. The method of claim 1, wherein the etching of the planarizing layer includes anisotropic etching.

6. The method of claim 1, wherein removing of the second oxide layer includes dilute hydrofluoric wet etching of the second oxide layer.

7. The method of claim 1, further comprising:
forming a second nitride layer over the portion of the ONO layer over the first fin structure;
forming a third oxide layer over the second nitride layer;
forming an additional planarizing layer over the third oxide layer, exposing second fin structure while covering the first fin structure;
removing exposed portions of the third oxide layer;
removing the additional planarizing layer to expose the third oxide layer over the first fin structure;
removing the second nitride layer over the second fin structure; and
forming a gate electrode to contact the second nitride layer over the first fin structure.

8. The method of claim 1, further comprising forming an insulator adjacent the first fin structure prior to forming the ONO layer.

9. The method of claim 8, further comprising:
removing exposed portions of the first oxide layer from the intact portion of the ONO layer over the first fin structure and a remaining portion of the second oxide layer after the removing of the nitride layer over the second fin structure;
forming a gate oxide over the second fin structure and the nitride layer remaining over the first fin structure; and
forming a gate electrode to contact the gate oxide.

10. A method of forming an integrated circuit (IC) structure, the method comprising:
forming an ONO layer including: a first oxide; a nitride layer over the first oxide; and a second oxide layer over the nitride layer, over a precursor structure including: a substrate; a deep trench within the substrate; a buried oxide (BOX) layer adjacent the deep trench; a first fin structure over the deep trench; and a second fin structure over the BOX layer;
forming an insulator layer adjacent the first fin structure;
forming a planarizing layer over the ONO layer and the insulating layer;
etching the planarizing layer to expose the second fin structure, leaving the first fin structure, the insulator layer and a portion of the ONO layer covered by a remaining portion of the planarizing layer;
removing the second oxide layer from exposed portions of the ONO layer;
removing the remaining portion of the planarizing layer to expose the portion of the ONO layer over the first fin structure;
removing the nitride layer over the second fin structure, leaving the portion of the ONO layer over the first fin structure intact;
removing exposed portions of the first oxide layer from the intact portion of the ONO layer over the first fin structure and a remaining portion of the second oxide layer;
forming a gate oxide over the second fin structure and the nitride layer remaining over the first fin structure; and
forming a gate electrode to contact the gate oxide.

11. The method of claim 10, wherein removing of the second oxide layer includes dilute hydrofluoric wet etching of the second oxide layer.

12. The method of claim 10, wherein the first fin structure forms part of a first fin, and wherein the second fin structure forms a portion of a second fin adjacent the first fin, wherein the first fin is oriented in an opposite direction relative to the second fin.

13. The method of claim 10, wherein the insulator includes at least one of silicon oxide or silicon nitride.

14. An integrated circuit (IC) structure comprising:
a substrate;
a deep trench within the substrate;
a buried oxide (BOX) layer adjacent the deep trench;
a first fin structure over the deep trench;
a second fin structure over the BOX layer;
an ONO layer over the first fin structure; and
a gate electrode contacting the ONO layer.

15. The IC structure of claim 14, wherein the ONO layer includes:
a first oxide layer;
a nitride layer over the first oxide; and
a second oxide layer over the nitride layer,
wherein the first oxide of the ONO layer covers the second fin structure.

16. The IC structure of claim 15, wherein the nitride layer and the second oxide layer extend over only the first fin structure.

17. The IC structure of claim 15, further comprising:
a second nitride layer over the ONO layer over the first fin structure; and
a third oxide layer over the second nitride layer.

18. The IC structure of claim 15, wherein the ONO layer includes:
a first oxide layer;
a nitride layer over the first oxide layer; and
a gate oxide layer over the nitride layer,
wherein the gate oxide of the ONO layer covers the second fin structure, and wherein the nitride layer and the first oxide layer extend over only the first fin structure.

19. The IC structure of claim 18, further comprising an insulator adjacent the first fin structure.

* * * * *